US011745413B2

(12) United States Patent
Hanrath et al.

(10) Patent No.: US 11,745,413 B2
(45) Date of Patent: Sep. 5, 2023

(54) METHODS OF NANOMANUFACTURING AT FLUID INTERFACES AND SYSTEMS FOR SAME

(71) Applicant: Cornell University, Ithaca, NY (US)

(72) Inventors: Tobias Hanrath, Ithaca, NY (US); Eliad Peretz, Ithaca, NY (US); Ben Treml, Dayton, OH (US)

(73) Assignee: CORNELL UNIVERSITY, Ithaca, NY (US)

( * ) Notice: Subject to any disclaimer, the term of this patent is extended or adjusted under 35 U.S.C. 154(b) by 716 days.

(21) Appl. No.: 16/302,076

(22) PCT Filed: May 16, 2017

(86) PCT No.: PCT/US2017/032934
§ 371 (c)(1),
(2) Date: Nov. 15, 2018

(87) PCT Pub. No.: WO2017/201067
PCT Pub. Date: Nov. 23, 2017

(65) Prior Publication Data
US 2019/0143584 A1     May 16, 2019

Related U.S. Application Data

(60) Provisional application No. 62/336,972, filed on May 16, 2016.

(51) Int. Cl.
*B29C 64/124* (2017.01)
*B33Y 10/00* (2015.01)
(Continued)

(52) U.S. Cl.
CPC .......... *B29C 64/124* (2017.08); *B29C 64/245* (2017.08); *B29C 64/371* (2017.08);
(Continued)

(58) Field of Classification Search
CPC ..... B29C 64/124; B29C 64/371; B33Y 10/00; G03F 7/0037
(Continued)

(56) References Cited

U.S. PATENT DOCUMENTS

| | | | | |
|---|---|---|---|---|
| 10,259,171 | B2* | 4/2019 | Robeson | ............... B29C 64/129 |
| 10,589,512 | B2* | 3/2020 | DeSimone | ............ B29C 64/393 |
| 2009/0105363 | A1 | 4/2009 | Napadensky | |
| 2009/0261287 | A1* | 10/2009 | Withey | ................. B29C 64/135 |
| | | | | 524/439 |

(Continued)

FOREIGN PATENT DOCUMENTS

| | | |
|---|---|---|
| WO | 2016/007495 A1 | 1/2016 |
| WO | 2016/046216 A1 | 3/2016 |

OTHER PUBLICATIONS

Velichko, Yuri S et al. "Electric Field Controlled Self-Assembly of Hierarchically Ordered Membranes." Advanced functional materials vol. 22,2 (2012): 369-377. doi:10.1002/adfm.201101538 (Year: 2012).*

(Continued)

*Primary Examiner* — Hana C Page
(74) *Attorney, Agent, or Firm* — Paul J. Roman, Jr.; Johnson, Marcou, Isaacs & Nix, LLC

(57) ABSTRACT

Methods of nanomanufacturing based on continuous additive nanomanufacturing at fluid interfaces (CANFI). This approach is a fabrication technique that involves, for example, photocuring or "printing" self-assembled layers. CANFI presents a fabrication capability with significant transformative potential improve (i) the spatial resolution, (ii) the speed, and (iii) the range of material compositions that can be printed. Various articles of manufacture can be made using the methods.

22 Claims, 8 Drawing Sheets

(51) Int. Cl.
*B33Y 30/00* (2015.01)
*B33Y 40/00* (2020.01)
*B29C 64/245* (2017.01)
*B29C 64/371* (2017.01)
*C09K 11/02* (2006.01)
*G03F 7/00* (2006.01)
*C09K 11/88* (2006.01)
*B82Y 30/00* (2011.01)
*B82Y 40/00* (2011.01)

(52) U.S. Cl.
CPC .............. *B33Y 10/00* (2014.12); *B33Y 30/00* (2014.12); *B33Y 40/00* (2014.12); *G03F 7/0037* (2013.01); *B82Y 30/00* (2013.01); *B82Y 40/00* (2013.01); *C09K 11/02* (2013.01); *C09K 11/881* (2013.01)

(58) Field of Classification Search
USPC ........................................................ 264/401
See application file for complete search history.

(56) References Cited

U.S. PATENT DOCUMENTS

| | | |
|---|---|---|
| 2013/0292862 A1 | 11/2013 | Joyce |
| 2015/0165678 A1* | 6/2015 | Ding .................... B29C 64/124 425/150 |
| 2015/0234270 A1* | 8/2015 | Doyle .................. G03F 7/2035 435/188 |
| 2015/0360419 A1 | 12/2015 | Willis et al. |
| 2017/0306221 A1* | 10/2017 | Koole ................. C09D 183/04 |
| 2018/0064920 A1* | 3/2018 | Desimone ............. B33Y 80/00 |
| 2018/0361773 A1* | 12/2018 | Billiet ................... B33Y 30/00 |

OTHER PUBLICATIONS

Sundararajan ("Supercritical CO2 Processing for Submicron Imaging of Fluoropolymers" Chem. Mater. 2000, 12, 41-48). (Year: 2000).*

Aldrich ("Laser Fundamentals"), Available Jul. 2021 (Year: 2021).*

* cited by examiner

METHODS OF NANOMANUFACTURING AT FLUID INTERFACES AND SYSTEMS FOR SAME

CROSS REFERENCE TO RELATED APPLICATIONS

This application claims priority to U.S. Provisional Application No. 62/336,972, filed on May 16, 2016, the disclosure of which is hereby incorporated by reference.

STATEMENT REGARDING FEDERALLY-SPONSORED RESEARCH OR DEVELOPMENT

This invention was made with government support under grant no. NNX15AP62H awarded by the National Aeronautics and Space Administration and grant nos. DMR-1056943 and NSF-CMMI-1510024 awarded by the National Science Foundation. The government has certain rights in the invention.

FIELD OF THE DISCLOSURE

The disclosure generally relates to additive manufacturing processes and products made using such processes. More particularly the disclosure generally relates to continuous additive nanomanufacturing processes.

BACKGROUND OF THE DISCLOSURE

New opportunities to create materials with properties by design continue to emerge from our ability to control the structure and composition of nanomaterials through wet-chemistry synthesis methodologies. Access to these materials has provided insights into understanding of and control over the fundamental structure-property relationships. At the same time, prototype nanomaterial-based technologies have advanced tremendously as evidenced by impressive progress in a broad range of applications spanning sensors, membranes, catalysis, magnetic data storage, electronics, displays, photodetectors, photovoltaics, energy storage, and thermoelectrics. Along with rising expectations, there is growing recognition that progress towards the promise of nanomaterial-enabled technologies depends on solving outstanding fabrication challenges. In particular, there is a need to bridge the length-scale gap between millimeter scale devices and nanometer scale components.

Wet synthesis routes of colloidal nanostructures have facilitated access to a broad range of building blocks with precisely controlled size, shape, and composition. Successful prototype demonstrations in the lab are a testament to the immense commercial potential of emerging applications of nanomaterials. However, there is growing recognition that the rapid progress towards acclaimed nanotechnologies risks stagnation unless significant barriers concerning cost-effective and scalable system-level integration into functional device structures are resolved.

Inkjet-printing and spray coating have potential for the high-speed and large-area processing of nanocrystal thin films. However, the solvent evaporation rates encountered in these techniques are generally too fast to allow a quantum dots (QD) to assemble into an ordered superstructure. On the other hand, Langmuir Blodgett, Langmuir-Schaefer and other modifications of the liquid/gas interfacial assembly approach are characterized by much slower evaporation rates and enable the formation of highly ordered monolayers. Among the various evaporation-driven assembly approaches that have been reported, self-assembly at fluid surfaces have yielded the highest quality (i.e., large grain size, high spatial coherence) superlattices. However, these interfacial assembly approaches cannot be applied to the manufacturing of devices and materials with more complex 3D geometries.

Additive manufacturing has evolved in the past few years to become a powerful and versatile fabrication technique with multiple applications. Whereas 3D printers were initially applied for rapid prototyping (mostly from plastics), recent advances have demonstrated the ability to fabricate more complex materials and devices including biological tissues, batteries, and optoelectronic devices. Despite this rapid progress, the majority of currently available 3D printing technologies face three significant limitations: (i) the spatial resolution, (ii) the speed, and (iii) the range of material compositions that can be printed.

BRIEF DESCRIPTION OF THE FIGURES

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments and examples, other embodiments, including embodiments that do not provide all of the benefits and features set forth herein, are also within the scope of this disclosure. Various structural, logical, process step, and electronic changes may be made without departing from the scope of the disclosure.

Ranges of values are disclosed herein. The ranges set out a lower limit value and an upper limit value. Unless otherwise stated, the ranges include all values to the magnitude of the smallest value (either lower limit value or upper limit value) and ranges between the values of the stated range.

The present disclosure provides methods of forming three-dimensional objects at an interface between a precursor layer and a support layer. The methods can be referred to as continuous additive nanomanufacturing at fluid interfaces (CANFI). The present disclosure also provides systems and article of manufacture.

Figure 1:
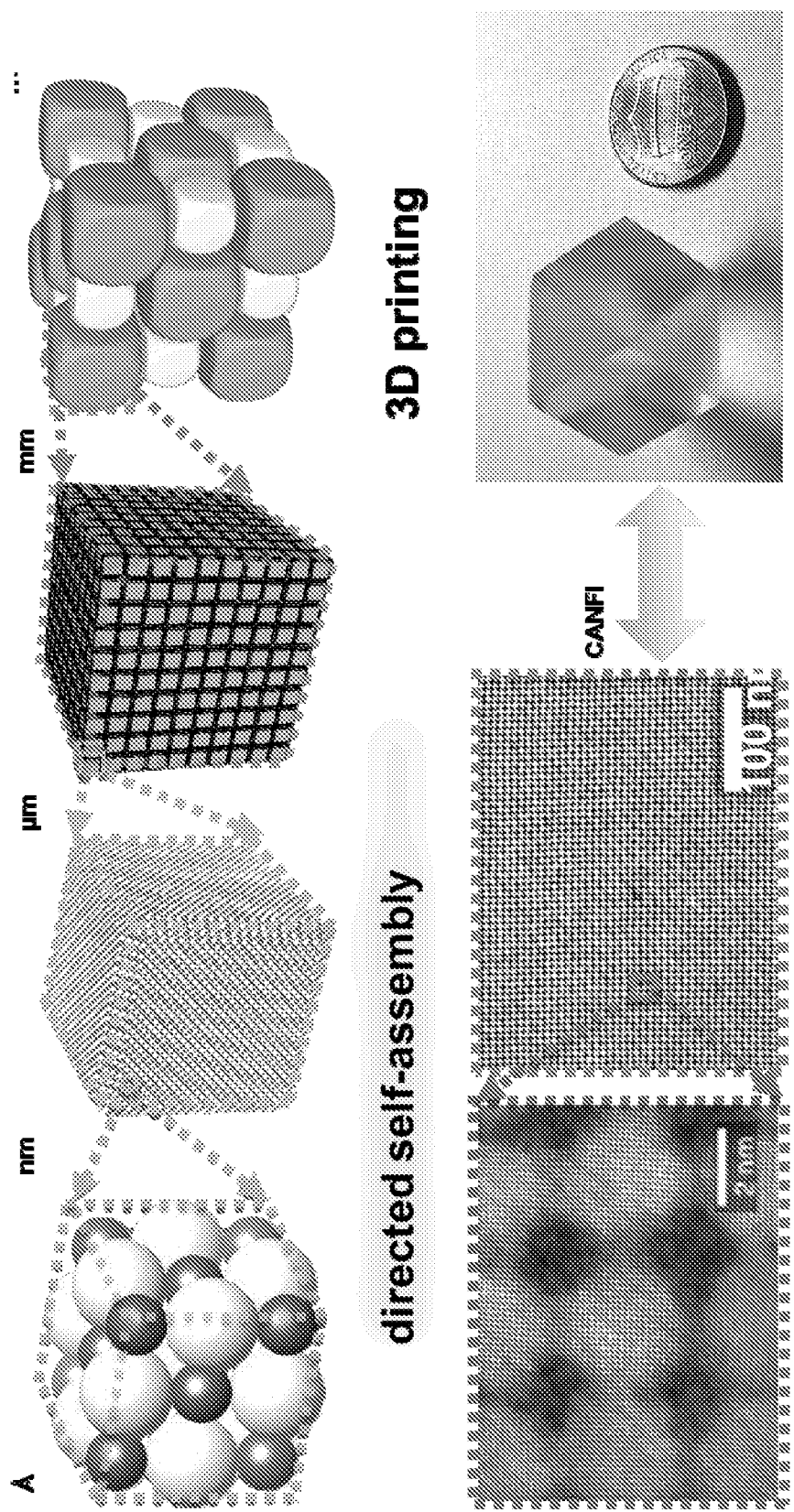
FIG. 1 shows continuous additive nanomanufacturing of materials with controlled structure and composition spanning six orders of magnitude in length scale and illustrates how the integration of bottom-up self assembly methods and additive manufacturing methods can enable the formation of materials and devices with controlled composition across five or more orders of magnitude in length scale. This specific example also illustrates the controlled composition of individual quantum dots at the atomic scale spanning to the controlled formation of hierarchical assemblies ranging all the way to millimeter and centimeter scale structures.

This work demonstrates nanomanufacturing capabilities that enable the production of materials and devices with precisely programmed structure, composition, and function across six orders of magnitude in length scale. Combined control over individual nanostructures (at atomistic length scales), programmable molecular assembly of micrometer superstructures and advanced manufacturing methods (spanning micrometer to meter) enables creation of a new class of materials and devices. Continuous additive nanomanufacturing at fluid interfaces (CANFI) derives from the synergistic integration of recent advances in directed self-assembly and 3D printing to bridge the manufacturing length scale gap illustrated in FIG. 1. CANFI addresses challenges related to spatial resolution, speed, and range of material compositions that can be printed and presents a potentially transformative advance toward nanomanufacturing capabilities with unprecedented resolution, speed and complexity of materials and devices that can be fabricated. CANFI combines advanced nanomaterial synthesis, directed assembly, and additive manufacturing.

Generally the CANFI process can be applied to any photoresponsive liquid that can be spread across a fluid surface, beyond colloidal nanomaterials, this process is also compatible with conventional (i.e., polymer-based) photoresins used in currently available photolithography and stereolithography 3D printing. For example, CANFI can be applied to colloidal nanomaterials. CANFI can be applied to a broad range of colloidal nanomaterials as ingredients in the forming layer. CANFI combines the benefits of high fidelity assembly and extends it towards the nanomanufacturing of complex structures.

CANFI provides improved spatial resolution of the printed structures. The spatial resolution (in the z-direction) relates to the size of the building blocks in the forming layer. In the case of colloidal nanocrystals, the z-resolution becomes the diameter of the building blocks, which can be as small as 1-2 nm. For comparison, spatial resolution for systems that use DLP and SLA have bottom border around 1-5 microns for a layer (z axis). The x-y resolution depends on the quality of the light source. Dual ion lithography resolution can go down to around 100 nm feature size, but this process is slow and expensive.

CANFI also provides improved print speed. Conventional DLP systems are limited to print speeds on the order of a few mm/hr. The recent CLIP system achieved print speeds approaching 1000 mm/hr (albeit at compromised resolution). The CANFI system can achieve even faster print speeds. CANFI can print approximately 10× faster (e.g. 10 cm/hr) without compromised resolution.

The CANFI approach also is versatile. CANFI can be applied to QDs or a broad range of emerging nanomaterial-enabled technologies. CANFI fabrication can be applied to a broad range of colloidal nanoparticles (e.g., metal, metal oxide, semiconductor) that can be dispersed across the liquid subphase. The CANFI process can also be applied to molecular precursors (e.g., polymer resins or biological materials). Another example is to print block-copolymers, thereby combining molecular assembly and multifunctional polymer systems with hierarchical fabrication enabled by CANFI. Concerning nanomaterial-enabled technologies, the CANFI approach can be applied to create 2D and 3D structures from a broad range of nanomaterials that have emerged from the past decade of intensive research in the field (this might be a bit too broad and generic, but we see this as a broadly enabling fabrication platform). The CANFI approach can be used to 'print/fabricate' materials with specific electronic, optical, magnetic, biological functionality. One example is 3D printed electronics for e.g., displays, solar cells, batteries.

An article of manufacture, such as a three-dimensional structure, can be made using CANFI. Examples of articles of manufacture that can be made using methods of the present disclosure include, but are not limited to, electrochemical systems (batteries, supercapacitors), optoelectronic devices (e.g., displays), sensors (e.g., micro and nanofluid systems), biological structures (collagen), foods, and organs. A broad range of articles of manufacture are described in Lipson and Kurman "Fabricated: The New World of 3D Printing" John Wiley & Sons, Inc., Feb. 1, 2013.

In an aspect, the present disclosure provides methods of forming a three-dimensional structure. The methods are based on formation of product layers (which can form three-dimensional objects) at an interface between a precursor layer and a support layer (e.g., at a liquid-liquid or liquid-fluid interface between a precursor layer and a support layer an interface. The methods can be referred to as nanomanufacturing methods or CANFI methods.

For example, a method of forming an article of manufacture (a three-dimensional structure) comprises: providing a precursor material layer disposed on (in contact with) a support material layer, wherein the precursor material and support material are different materials, the precursor material layer and support material layers are discrete layers, and an interface (e.g., a stable interface) is formed between the precursor layer and support material layer; and applying energy (e.g., mechanical energy, electromagnetic energy) to the precursor material layer such that a product material is formed (e.g., by formation of one or more chemical bonds between two or more molecules (e.g., covalent bond formation such as cross-linking, non-covalent bond formation, or formations of an epitaxial inorganic bond, or by controlled coalescence of proximate building block materials) in the precursor material layer, phase transition of one or more molecules in the precursor material layer), wherein the product material layer is continuous or discontinuous and is capable of being separated from the remaining precursor material in the precursor material layer.

A liquid precursor layer is provided. The liquid precursor layer is formed from a liquid precursor. The liquid precursor can form a self-assembled layer (e.g., a self-assembled liquid precursor layer). The individual molecules in the liquid precursor layer can self-assemble and provide self-assembled structures (i.e., ordered structures) having a dimension (e.g., x and/or y dimension) of, for example, 1 nm to 1 mm. For example, nanomaterials (e.g., quantum dots as shown in, for example, FIGS. 4 and 9) can for self-assembled structures (i.e., connections between adjacent nanomaterials) in three dimensions (x, y, and z (layer thickness) dimensions). The self-assembled nanostructures can result from orientation of one or more crystal facets and can results in formation of porous materials (which can be used as channels in, for example, microfluidic devices such as, for example, sensors). Examples of self-assembled layers include, self-assembled quantum dot superlattices, nanoparticle superlattices, block copolymers, biological layers, lipid bilayers, S-layers.

The liquid precursor layer can comprise any photoactive materials (e.g., a photoresin and/or nanoparticles) that can be spread across a fluid interface and form a stable liquid-liquid or liquid-fluid interface with an immiscible fluid subphase. The liquid precursor layer is spread across the fluid subphase and is not miscible with the fluid subphase. The liquid precursor layer can comprise inorganic materials and/or organic materials that can form product layers on application of energy to the liquid precursor layer. The liquid precursor layer can be a photoresponsive layer. The liquid precursor layer can be any fluid that can be dispersed across the fluid of another fluid; the top and bottom fluid should not be miscible. The liquid precursor layer can be formed from (can be) a colloidal suspension of nanoparticles (e.g., quantum dots) or organic materials (e.g., polymeric materials). The nanoparticles can be crystalline. The nanoparticles can have various morphologies. For example, the nanoparticles can be sphere, cubes, rods (any polyhedral shape) and/or can have specific dimensionality (e.g., 0D (spheres), 1D (rods or wires), or 2D sheets. Examples of inorganic materials include metal nanoparticles, metal oxide nanoparticles, quantum dots, such as, for example, PbS, CdSe, Si, or Ge nanoparticles and combinations thereof. Examples of organic materials include organic resins, such as, for example, monomers (polymer precursors), such as, acrylic monomers (e.g., PR48), polymers such as polystyrene, polyacrylates, polyethylene, polypropylene. Additional examples of organic materials include photoresists and photoresins. In other examples, the organic materials include any polymers that can be photo-crosslinked. The liquid precursor can include inorganic and organic materials (e.g., a mixture of one or more types of quantum dots and one or more resins and/or polymers).

The liquid precursor can comprise a solvent or combination of solvents. It may desirable that a solvent or solvents render good solubility to (or form a stable colloidal suspension with) the inorganic materials and/or organic materials and/or form a liquid-liquid interface or liquid-fluid interface with the support material. Appropriate solvent/support material pairs can be selected based on solubility criteria.

The liquid precursor can also comprise additives such as for example, additives that aid in controlling interfacial energies of the liquid-liquid interface or liquid-fluid interface formed by the liquid precursor layer and support material layer. The additives can control the orientation of precursors Examples of additives include, but are not limited to, surfactants.

The inorganic materials, e.g., nanoparticles such as, for example, quantum dots, can be surface functionalized with a photoresponsive ligands. Examples of photoresponsive ligands include acrylates (e.g., methacrylates). For example, the inorganic material has acrylate (e.g., methacrylate) based nanoparticle surface modifications. Examples of chemistries that can be used to photochemically crosslink nanoparticles include photoinduced cycloaddition (e.g., [4+2] photoinduced cycloaddition), photoinduced tetrazole-ene cycloaddition, photo-cross-linking of cinnamoyl groups, and photodimerization of anthracene. Ligands suitable for carrying these crosslinking reactions are known in the art. The nanoparticles can be surface functionalized with ligands that can by cross-linked using these chemistries. Photoresponsive ligands bound to the QD surface can be used to directly link QDs without the need of a photoresponsive polymer matrix.

Figure 3:
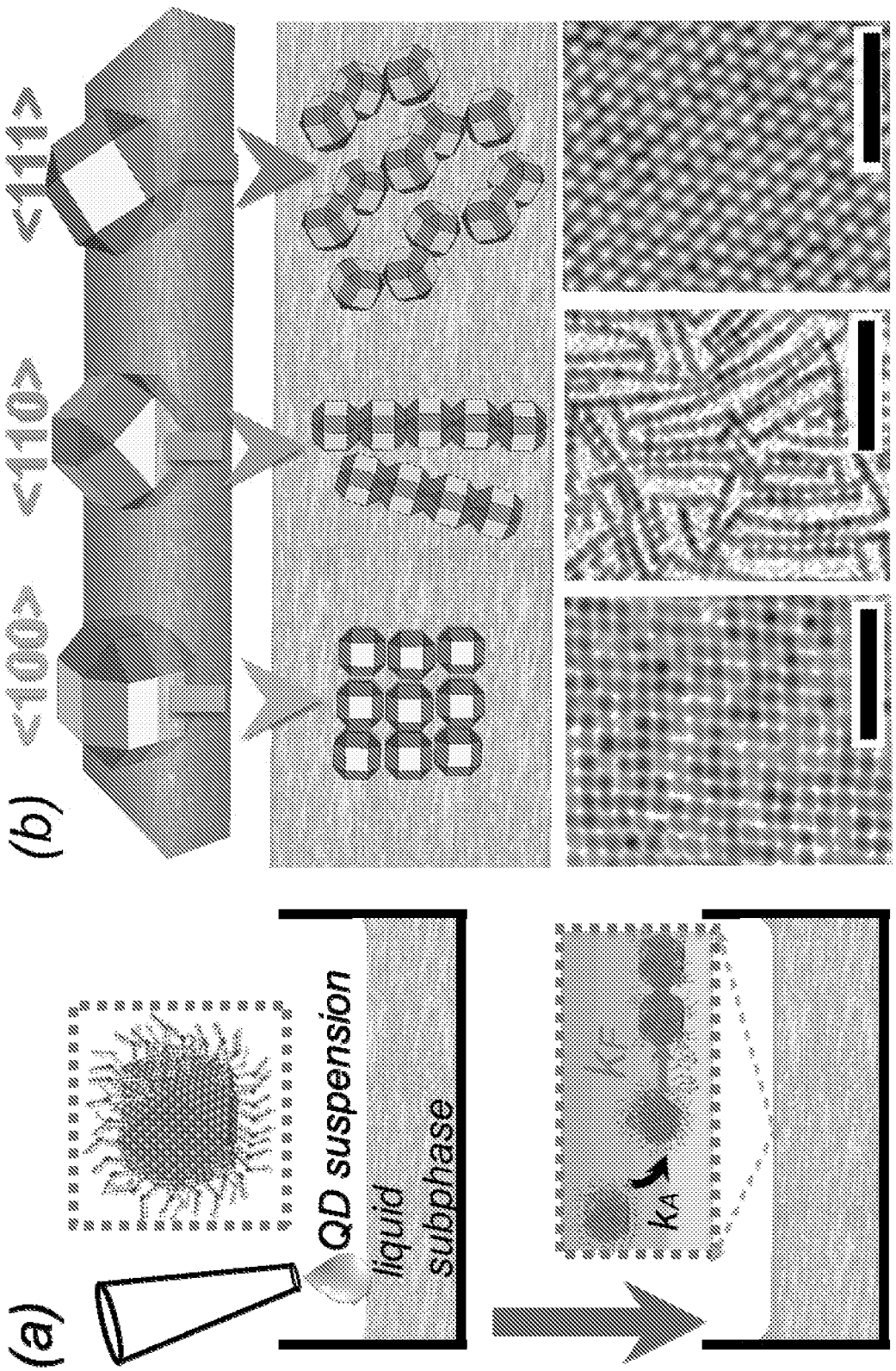
FIG. 3 shows (a) directed assembly and attachment of a QD at a liquid-liquid interface; (b) QD orientation (top) and multi-particle interactions at the fluid interface (middle) dictates the QD superstructure; TEM of square, line, and hexagonal structures; and scale bars: 50 nm (bottom).

Forming QD assemblies at the interface of two immiscible fluids introduces the prospect of combining self-assembly with directed attachment (e.g., interfacial chemical reactions that displace ligands from specific QD facets). These surface reactions play a role in processing techniques used to "connect the dots." For example, interfacial ligand displacement can yield QDs with anisotropic (e.g., patchy) ligand coverage and deprotected (e.g., sticky) crystal facets that can attach to similar facets on proximate QDs. In the case of colloidal lead salt QD, the ligand binding energy is weaker on the {100} facet relative to others, which leads to facet specific fusion of {100} surfaces (light facets in FIG. 3). QD superstructures can be fabricated that exhibit long-range spatial coherence in which proximate QDs are epitaxially connected. Control of QD orientation at the fluid interface and the nature of the multi-particle interactions (for examples as shown in FIG. 3) can provide predictable and specific assembly allotropes.

The precursor layer can be a photoactive precursor layer. A photoactive precursor layer can comprise, for example, monomer(s) and/or inorganic materials surface functionalized with photoactive ligands, and photoinitiator (e.g., diphenyl(2,4,6-trimethyl-benzoyl)phosphine oxide). For example, the photoactive precursor layer can comprise trimethylolpropane triacrylate monomers and diphenyl(2,4,6-trimethyl-benzoyl)phosphine oxide as photoinitiator).

The precursor layer can comprise a mixture of inorganic and/or organic components. The individual components in a layer can be selective (e.g., form product layers in response to different energy. For example, individual components in a layer are spectrally selective (e.g., form product layers in response to different wavelengths of energy. In the case where a layer comprises two or more components, a product layer comprising a heterostructure can be formed. A precursor layer comprising For example, the precursor layer comprises one or more nanomaterial and one or more polymeric material (e.g., photopatternable organic material). The nanomaterial can be a colloidal suspension in the organic material.

The precursor materials in an individual precursor material layer can have a variety of volume fraction values. For example, in the case of nanomaterials, the volume fraction of nanomaterial components (e.g., nanoparticles) in an individual precursor material layer can be, depending on morphology, 70% or greater, 80% or greater, or 90% or greater. For example, in the case of liquid precursor materials, the volume fraction of precursor materials (e.g., polymer(s) or monomer(s)) can be 50% to 70% or 50% to 80%.

The initial concentration of precursor materials, e.g. nanoparticles, in the precursor material layer may be lower. A precursor material layer may be formed by dispersing a precursor material having a lower concentration that desired for the precursor material layer across the interface (e.g., 10% volume fraction) and allowing at least a portion of the liquid (e.g., solvent) to evaporate (increasing the concentration from, for example, 10 to 50% volume fraction, and then initiating the application of energy (e.g., photopatterning). Accordingly, a method may further comprise preconcentration of one precursor material in one or more precursor material layer prior to application of energy (e.g., patterning such as, for example, photopatterning)) of the precursor material layer.

The support material sub-layer provides a platform on which a layer of precursor material is formed. In an example, a support material is a non-curable support material. In an example, the support material layer is a fluid support layer such as, for example, a liquid support layer. By "non-curable" it is meant that the support material does not undergo a chemical reaction (e.g., a cross-linking reaction). In an example, the support material is a non-curable fluid support layer such as, for example, non-curable liquid support layer. For example, the non-curable fluid support layer is a supercritical fluid. The liquid precursor material layer is disposed on or otherwise in contact with a support material layer. The precursor material layer and support material layers are discrete layers (i.e., discrete phases). A liquid-liquid interface or liquid-fluid interface forms between at precursor material layer and a support material layer. An interface (e.g., a stable interface) is formed between the precursor layer and support material layer. The precursor material layer and support material layer are comprised of different materials (e.g., different fluids). The important support material parameters are density (support fluid should be more dense) and immiscible with the precursor material layer. The support material layer can comprise (or consist of a polar liquid or non-polar liquid. The support material layer can comprise a mixture of liquids. The precursor material can be marginally soluble (e.g., has a solubility of less than 1% by weight), but is immiscible in the support material. For example, the precursor material is not soluble, but is immiscible in the support materials. Examples of support material layers include polar solvents (e.g., water, ethylene glycol, dimethylformamide) and halogenated solvents (e.g. chloroform).

The liquid precursor layer can have various thicknesses (z-direction/dimension thickness). For example, a liquid precursor layer has a thickness of 1 nm to 1 micron (or thicker). The upper limit for the thickness of a liquid precursor layer is defined by the extinction length of the light used to write the pattern. For a top-side illumination of the liquid precursor layer (illumination of the layer from the side opposite the support layer), the thickness of the liquid precursor layer can be, for example, 10 nm to 50 nm (or thicker). For a bottom-side illumination of the liquid precursor layer (illumination of the layer from the side in contact with the support layer), the thickness of the liquid precursor layer can be, for example, 1 nm to 1 micron (e.g., 1 nm to 500 nm). The liquid precursor layer can be a self-assembled monolayer (e.g., a molecular self-assembled monolayer). In various examples, the liquid precursor layers comprises 1 to 10 (e.g., 1, 2, 3, 4, 5, 6, 7, 8, 9, 10 monolayer(s)) self-assembled monolayers.

Multiple liquid product layers can be used. In an example, multiple liquid product layers, which individually can be the same or different composition that one or more other liquid product layers, are used sequentially. In another example, multiple liquid product layers, which have different composition, form distinct layers, and can form patterned layers on application of different energy (e.g., different wavelength(s) of electromagnetic radiation), are used at the same time.

Energy, such as mechanical, electromagnetic energy or electron beam energy, is applied to the precursor material layer such that a product material layer is formed. In various example, the electromagnetic energy is applied in a direct write or projection mode. The electromagnetic radiation can have a desired wavelength or wavelengths or an electron beam. In various examples, the electromagnetic radiation has one or more wavelengths in the infrared, visible, ultraviolet (UV), or extreme UV, or x-ray regions of the electromagnetic spectrum or a combination thereof. For example, the electromagnetic radiation has a wavelength or plurality of wavelengths in the range of 100 pm to 10 microns, including all nm values and ranges therebetween. The electromagnetic energy (e.g., light) used for photopatterning can be polarized. For example, polarized light is used to selectively pattern specific sub-system of a birefringent photoactive layer that responds to the polarization (e.g., a precursor layer, such as, for example, a photoresist or photoresponsive liquid layer in which the active materials in the layer absorbs light only under a certain polarization (e.g., when the liquid-crystal like chains in the active material are aligned with the polarization of the light used to pattern). This introduces another level of control, the alignment of fibers in the active layer can be controlled and thereby control if the active layer absorbs and reacts with light of the corresponding polarization.

Figure 11:
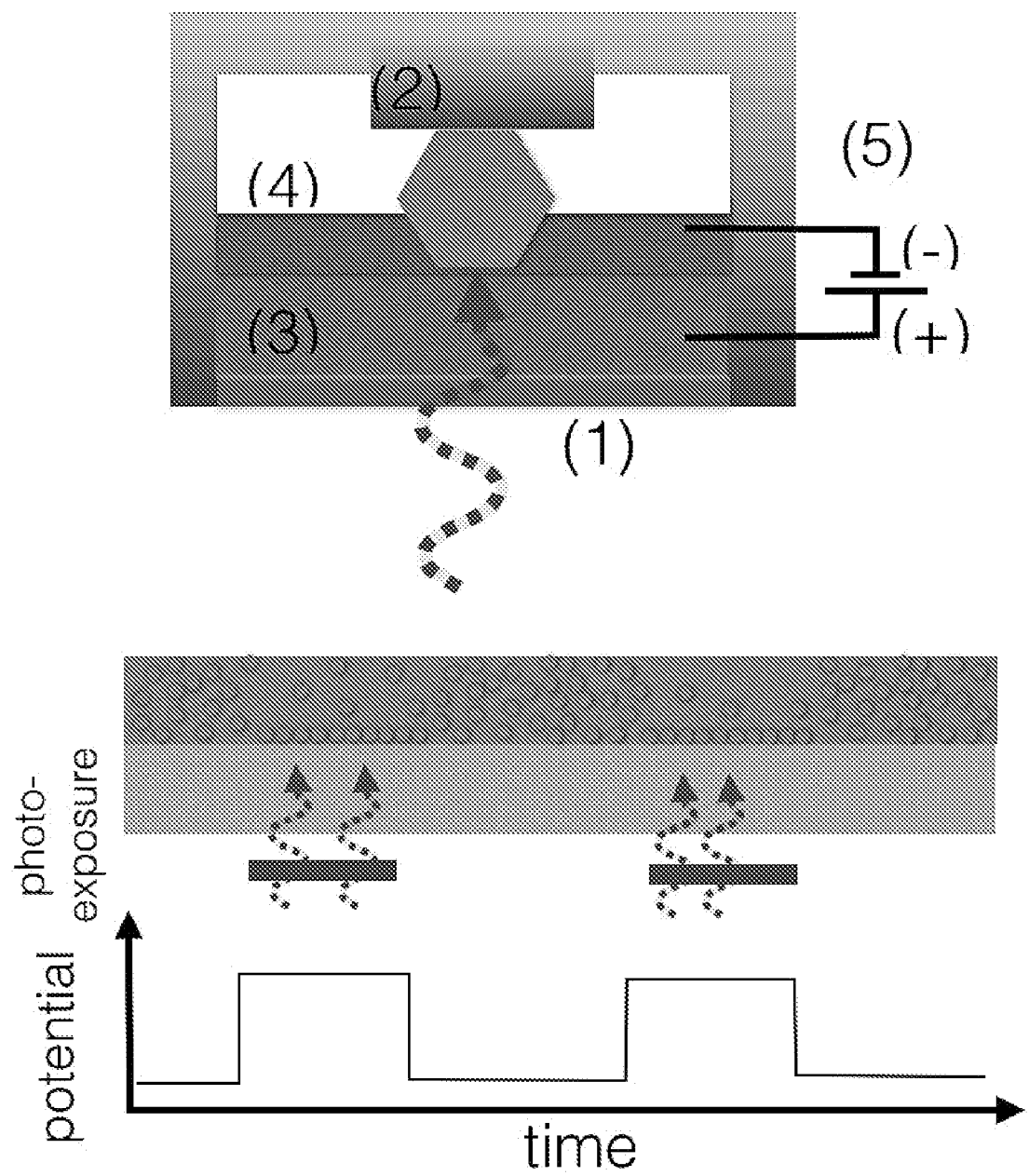
FIG. 11 shows a design of the CANFI cell. Shown is the embodiment with "bottom illumination" and potentiostatically controlled interfacial particle concentration. (1) exposure window, (2) build stage, (3) subphase fluid, (4) resin layer, (5) potentiostat.

The absorption of precursor materials such as, for example, nanoparticles and/or the concentration of precursor materials such as, for example, nanoparticles the interface between two immiscible fluids or an immiscible liquid and fluid can be controlled by application of an electrostatic potential across the interface. For example, in the case of a bottom-illuminated CANFI cell, the concentration of nanoparticles at the interface can be reversibly modulated through the application of an electrostatic potential across the precursor layer(s)/subphase interface. As example of a typical fabrication sequence, a bias is applied across the interface between two immiscible electrolyte solutions (e.g., the precursor layer at the top and the subphase at the bottom). The Galvani potential difference between the two liquid phases can be biased potentiostatically with a potential-time profile that is synced to the light dosage for patterning as shown in FIG. 11. The applied potential is typically within the range of +/−3V, depending on the electrolyte concentration in the top and bottom phase and the nature of the materials (e.g., particles) in the precursor layer. In an example, the concentration of precursor materials (e.g., photoactive species) at the liquid-fluid or liquid-liquid interface is controlled by the application of an electrostatic pulse (e.g., applying an electrical potential across the fluid interface can increase or decrease the concentration of particles at the fluid interface). Depending on the polarity of the particles and the polarity of the potential, this approach can also be used to select which layer is formed. In an example, (+) potential is applied to drive (−) charged A particles to the interface and form a product layer, then (−) potential is applied to drive (+) charged B particles to the interface and form a product layer. This way we could also form ABAB or ABBA or any sequence of materials. This is particularly powerful if combined with spectrally selective methods discussed herein. In an example, a precursor layer comprises A and C (B and D) precursor materials which are both −(+) charged. A,B responds to 385 nm and C,D to 405 nm. The combination of electrostatic potential and spectral selectivity then allows us to form a product layer comprising specific combinations of A, B, C, and D (e.g., ABCD, ABAD, ABAD, etc.). In the case of nanoparticles + and − charges (so called zeta potential) of the particles can be controlled by changing the surface chemistry of the nanoparticles.

Figure 2:
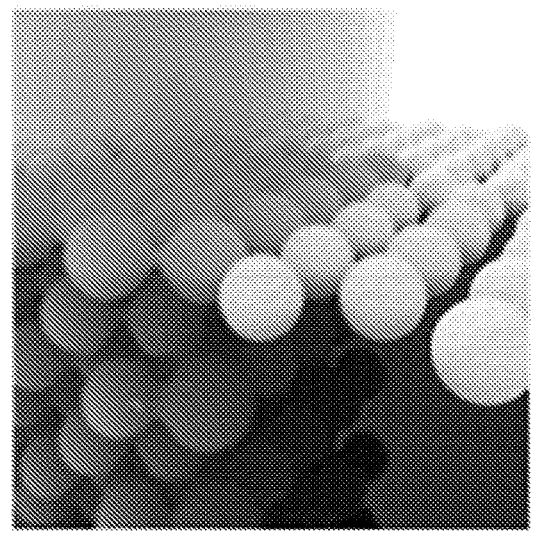
FIG. 2 shows (a) a view of laser sintering of QD assemblies at a fluid interface to yield 3D hierarchical structures. (b) Laser annealing of isolated QDs and demonstrates the ability to control fusion of proximate dots to yield structures with precisely defined size-dependent properties
Figure 2:
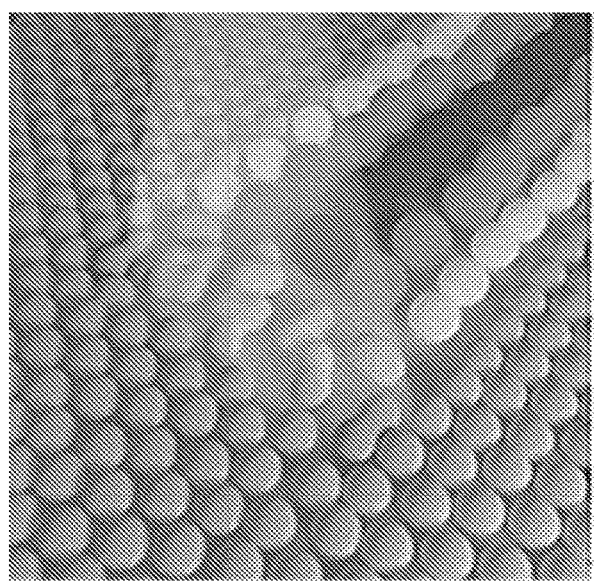
Figure 2:
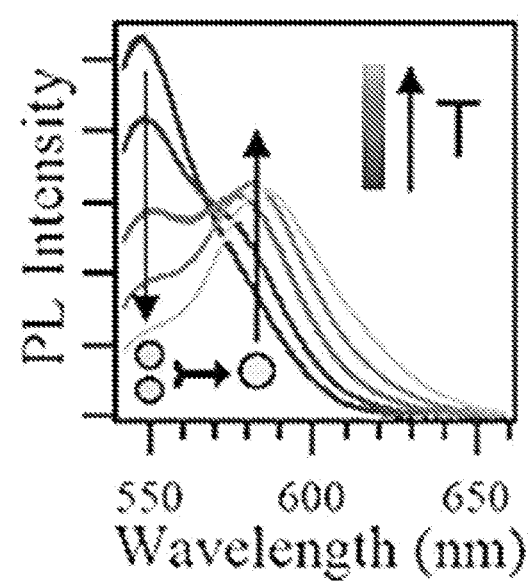

Examples of the product material include metals, metal oxides, semiconductor materials, organic materials such as, for example, polymers, etc. For example, the product layer is formed by selectively contacting the precursor layer with electromagnetic radiation (e.g., using a laser in a direct write mode) such that a product material layer (e.g., a patterned product material layer) is formed. The product material layer can be formed by annealing (e.g., partial or complete fusion) of individual components (e.g., individual nanomaterial components such as, for example, nanomaterial particles). An example is shown in FIG. 2b. In this case, enough of the nanomaterials are fused to form a coherent layer (e.g., all of the nanomaterials in the layer or pattered layer are fused). The product material layer can be formed by photo-cross-linking of individual components (e.g., monomers or functionalized nanoparticles). In this case, enough of the precursors (e.g., functionalized nanomaterials, monomers, polymers are polymerized and/or crosslinked to form a coherent layer (e.g., less than all of the nanomaterials in the layer or pattered layer are polymerized and/or crosslinked).

The amount of energy required to form a product material layer is dependent on the nature of the precursor material. For example, ~90 mJ/cm$^2$ can be used to form precursor layers comprising nanomaterials (e.g., quantum dots). In other examples, lower dosages can be used to form product material layers from photoresponsive molecules like functionalized nanomaterials, photoresists, and photoresins. In the case of precursor layers comprising quantum dots, it may desirable to use sufficient energy to cause irreversible attachment of proximate dots and, optionally, melts at least a portion of the quantum dots.

Each individual product material layer can be formed, for example, by formation of one or more chemical bonds between two or more molecules (e.g., covalent bond formation such as cross-linking, non-covalent bond formation, or formations of an epitaxial inorganic bond, or by controlled coalescence of proximate building block materials) in the precursor material layer.

Product material (e.g., a product material layer) can also be formed by, for example, phase transition of one or more molecules in the precursor material layer).

Figure 4:
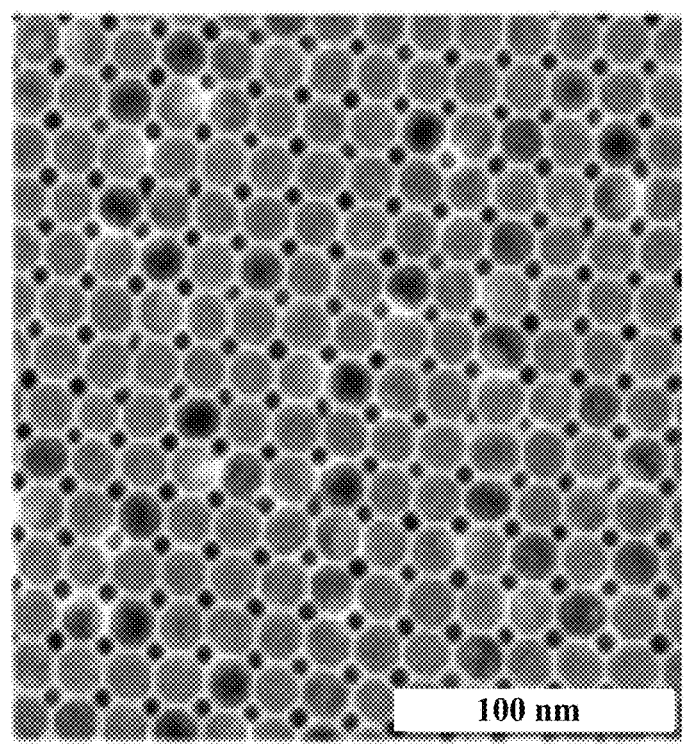
FIG. 4 shows a binary superlattice formed from PbSe and $Fe_2O_3$ nanocrystals.
Figure 8:
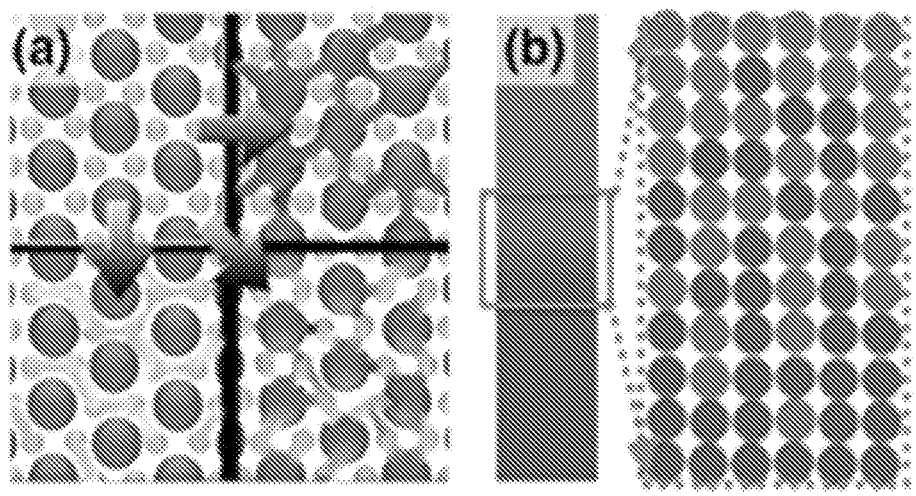
FIG. 8 shows multicomponent structures. (a) Potential morphologies resulting from selective sintering of components in an AB2 superlattice. (b) Compositional gradients in a layered multi-component film.

In the case, where the precursor material is quantum dots and the precursor layer has one or more binary superlattices (e.g., as shown in FIG. 4), one or more of the sub-components of a lattice can be selectively sintered (e.g., by contact with electromagnetic radiation from, for example, a laser) resulting in fusion of a plurality of quantum dots. The quantum dots can be fused in a predetermined pattern (e.g., based on selective exposure to electromagnetic radiation). Controlled fusion of PbSe QDs within the framework defined by an AB6 superlattice has been demonstrated. FIG. 8a illustrates candidate binary structures in which either one, or both sub-phases of the superlattice are fused. This selective fusion can be accomplished by two routes. First, direct, inorganic, dot-to-dot connections from direct photoexcitation can be formed by combining constituent particles whose melting thresholds are tuned by composition and size. Alternatively, the selective sintering can also be accomplished by functionalizing the surface of one of the nanoparticle components in the binary lattice with a photoactive linker.

The process can be carried out (e.g., the formation of one or more product material layers) without a polymerization reaction occurring during the forming. Accordingly, in various examples, a method of the present disclosure is carried out without organic monomer polymerization during formation of the product material layer.

The product layer can have various thicknesses (z-direction/dimension thickness). For example, a product layer has a thickness of 1 nm to 1 micron (or larger). For a top-side illumination of the product layer (resulting from illumination of the layer from the side opposite the support layer), the thickness of the product layer can be, for example, 10 nm to 50 nm (or larger). For a bottom-side illumination of the product layer (illumination of the layer from the side in contact with the support layer), the thickness of the product layer can be, for example, 1 nm to 1 micron (e.g., 1 nm to 500 nm). The product layer can be a patterned (e.g., selectively fused) self-assembled monolayer.

The product material layer is continuous or discontinuous and is capable of being separated from the remaining precursor material in the precursor material layer. The product material layer can be porous. The patterned layer can be removed from the remaining (unaffected by the energy) precursor material in the precursor material layer. In an example, the patterned layer is translated relative to a surface of the liquid precursor material. A second precursor material layer (which may be the same or different precursor material than the precursor material in the precursor material layer) is formed.

A product material layer can be patterned. For example, a product material layer can have one or more features having a dimension (x,y-dimensions) parallel to the longest dimension of the product material layer. The lateral resolution (x and/or y dimensions) can be comparable to what can be achieved in photolithography systems. The product material layer can have one or more features having a dimension (x,y-dimensions) of 200 nm or greater. For example, the lateral resolution is on the order of the wavelength of the light used in the patterning (e.g., ~0.5 μm or greater).

Formation of the precursor layer and product material layer can be repeated to form a multilayer structure. For example, a second energy (e.g., mechanical energy, electromagnetic energy) is applied to the precursor material layer such that a second product material is formed. The second product material (e.g., second product material layer) may be formed by formation of one or more chemical bonds between two or more precursors (e.g., precursor molecules) as described herein in the second precursor material layer or phase transition of one or more precursors (e.g., precursor molecules) in the second precursor material layer. The second product material layer is continuous or discontinuous and is capable of being separated from the remaining precursor material in the precursor material layer and is disposed on the first product material layer.

The second patterned layer can be removed from the remaining (unaffected by the energy) precursor material in the second precursor material layer.

The forming and the applying steps can be repeated until the entire printed structure is completed. The number of repetitions depends on the z height of the feature, the z resolution and the precursor layer thickness. For example, a 0.5 meter (z height) objects with 25 micron accuracy (40 per mm) can be made using, e.g., 100 or 1000 rep per micron. For example, the forming and the applying steps are repeated 1 to 100,000 times.

The forming and the applying steps can be repeated continuously. The forming and the applying steps also can be repeated in a batch mode. In continuous mode, the printed structure is drawn continuously from the forming layer (akin to Czochralski crystallization) in 'batch' mode a layer is printed, the structure is withdrawn completely from the liquid and then reimmersed. Batch mode can be done to vary the composition between different layers.

The product material layer(s) can be subjected to one or more various post-fabrication processes. For example, layer (s) can be dried and/or annealed. In another example, the layer(s) are contacted with an organic material (e.g., a polymer) that can fill a portion or all of the void spaces (e.g., pores) in the layer(s).

Figure 7:
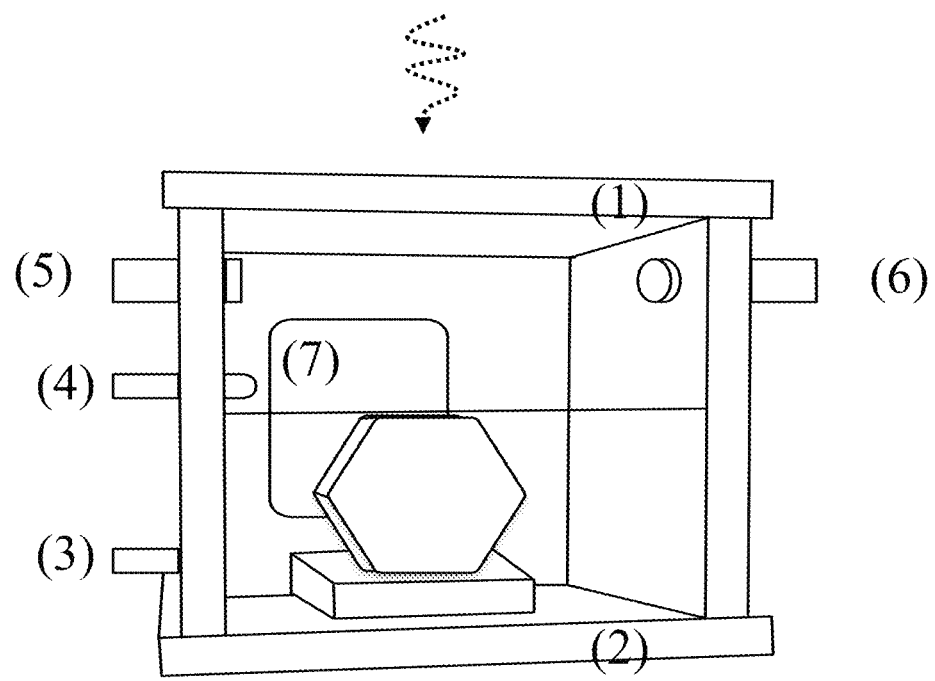
FIG. 7 shows a design of the CANFI cell showing (1) exposure window, (2) build stage, (3) subphase volume port, (2) PLF volume port, (3,4) gas flow and (7) Kapton window to enables multi-probe experiments.

In an aspect, the present disclosure provides systems. A system can be used to perform the methods (CANFI process) described herein. An example of a suitable system is shown in FIG. 7.

Displacement of the product layer can be accomplished by raising (or lowering) the precursor layer by adding (or removing) fluid from the subphase liquid. The system does not require a linear stage or a linear stage and motor to displace a product layer in the vertical direction (z-direction). In an example, a system does not comprise a linear stage or a linear stage and a motor, which can control a stage).

For example, the system includes a chamber defining a first opening and a second opening; a window disposed in the first opening; a light source configured to direct a beam into the chamber through the window (e.g., a material at least partially transparent to the light from the light source such as a Kapton window); a build stage disposed in the chamber; and a material injection system disposed in the second opening. The material injection system is configured to provide a liquid to the chamber, and wherein this liquid is configured to form a product material layer or layers (or an article of manufacture).

The light source can be a laser or other types of light sources. The light source can provide electromagnetic radiation having a desired wavelength or wavelengths or an electron beam. In various examples, a light source provides one or more wavelengths in the infrared, visible, ultraviolet (UV), extreme UV, or x-ray regions of the electromagnetic spectrum or a combination thereof. For example, a light source provides electromagnetic radiation having wavelength or plurality of wavelengths in the range of 100 nm to 10 microns, including all nm values and ranges therebetween. The light source can be configured to provide digital light processing or stereolithography. For example, a laser can be used to perform stereolithography. In an example, the light source (e.g., a laser) provides electromagnetic energy (light) is in the visible/near UV portion of the electromagnetic spectrum (e.g., light having a wavelength of 405, 385, or 365 nm). Examples of suitable lasers include, but are not limited to, carbon monoxide lasers.

The system can include a gas injection system and a gas exhaust system in fluid communication with the chamber. The gas injection system can be configured to provide an inert gas into the chamber. The inert gas can be, for example, nitrogen, argon, or air. The inert gas can be a blanket gas that protects the printed layer(s).

The material injection system can be configured to adjust a height of liquid in the chamber with a resolution of 5 nm. The material injection system may be a liquid injection system that adds liquid or a mechanical device to raise the height of the liquid (e.g., an inflatable bladder in the liquid).

The build stage can be configured to translate toward or away from the window. The build stage can have a translation resolution of 2-5 The build stage can have a translational resolutions on the order of 1 nm. For example, hydraulic force (e.g., a pump), mechanical force (e.g., piezoelectric materials) can be used to change the precursor level (i.e., push 1 milliliter into the pool, Ztras=Vinput/Sarea). In an example, a mechanism in which a dc motor is connected to a micro injector is used to ensure accurate deposition level, It is desirable to use a chamber made of a material (e.g., Teflon, etc.) that counters surface liquid effects at the edge of the chamber (wall liquid interface). In an example, a build stage is not configured (e.g., with a motor) to translate in the z-direction (perpendicular to the plane of the precursor liquid/substrate material interface.

During operation to form an article using additive manufacturing, the system illuminates a liquid in a chamber through a window with a light source to form at least part of the article on a build stage; translates a build stage with respect to the window and/or adding more of the liquid to the chamber with a material injection system; and forms an article of manufacture.

The material injection system (e.g., a pump) can be configured to adjust (add liquid and/or subtract liquid) a height of liquid (e.g., liquid precursor) in the chamber with a resolution of 5 nm or less. The material injection system (e.g., a pump) provides z-direction control. The build stage can be configured to translate toward or away from the window.

The walls of the chamber can be functionalized to reduce capillary distortions. For example, a chamber made from a material such as, Teflon or the like, or a chamber with a layer of such material disposed on the surfaces that contact the precursor layer and support layer container wall will reduce contact angle effects near the wall. It may be desirable to that the chamber be large enough such that capillary interface deformation effects near the center of the printed stage to be negligible.

The flow of support material (e.g., subphase liquid) into or out of the CANFI cell can be linked to a controller which in turn is linked to a coordinate interface movement with pattern exposure. In a typical process, the liquid-liquid interface or liquid-fluid interface can be displaced in a step-wise form (e.g., in between photoexposure) or nearly continuous for rapid printing.

The flow of subphase liquid into or out of the CANFI cell can be linked to a controller which in turn is linked to a coordinate interface movement with pattern exposure. In a typical process, the interface can be displaced in a step-wise form (in between photoexposure) or nearly continuous for rapid printing.

In an aspect, the present disclosure provides articles of manufacture. In various examples, an article of manufacture is made by a method of the present disclosure.

The methods can be used to form a variety of articles of manufacture. The articles of manufacture can comprise one or more layers that are functional (e.g., have one or more functional (active structures) and/or one more layers that are non-functional (e.g., do not active components), which may only provide structural support. Examples of articles of manufacture that can be made using a method of the present disclosure include architectural batteries (e.g., architectural batteries that have nano-controlled architecture), architectural bones (e.g., architectural bones that have micro-controlled bone inner matrices), cell matrices in polymers (e.g., micro/nano scale cell matrices), architectural metal (e.g., nano-structured, macro-size objects such as, for example, beams), conductive and non-conductive matrices (e.g., soft robots, fully printed electronic devices such as, for example, circuits embedded into a secondary material, organs (e.g., heart valves, muscles, etc., bio-electric interfaces, neuronal interfaces, light emitting diodes, photovoltaic devices (e.g., directly deposited properties trough carrying particles, radio-frequency devices (e.g., matrices of multi materials in 3D), MEMS devices, nanofluidic devices (e.g., nanofluidic devices with 3D architecture), multi material fibers (e.g., fiber and opto-electronic properties for lighting or energy harvesting, fiber and thermoelectric conversion for cooling or heating, etc.). The article of manufacture can formed at, for example, sub 100 nm dimensions.

The following Statements describe various non-limiting examples of methods and articles of manufacture of the present disclosure:

Statement 1. A method of forming an article of manufacture (a three-dimensional structure) comprising: providing a liquid precursor material layer disposed on (in contact with) a support material layer (e.g., a non-curable, fluid support layer or a non-curable liquid support material layer), wherein the precursor material and support material are different materials, the precursor material layer and support material layers are discrete layers, and an interface (e.g., a stable interface), which can be a liquid-liquid interface or liquid-fluid interface, is formed between the precursor layer and a support material layer (e.g., a non-curable, liquid support material layer) (e.g., wherein the precursor materials in the liquid precursor material undergo molecular-level self assembly); and applying energy (e.g., mechanical energy, electromagnetic energy, electron beam energy, or a combination thereof) (e.g., UV light, visible light, IR light, or X-ray light or a combination thereof) to the precursor material layer such that a product material is formed (e.g., by formation of one or more chemical bonds between two or more molecules (e.g., covalent bond formation such as cross-linking, non-covalent bond formation, or formations of an epitaxial inorganic bond, or by controlled coalescence of proximate building block materials) in the precursor material layer, phase transition of one or more molecules in the precursor material layer) (e.g., at the liquid-liquid interface or liquid-fluid interface of product material and a support material layer (e.g., a non-curable, liquid support material layer), where the product material layer is continuous or discontinuous and is capable of being separated from the remaining precursor material in the precursor material layer.

Statement 2. A method according to Statement 1, where the liquid precursor layer comprises a self-assembled material (e.g., a molecular level self-assembled material).

Statement 3. A method according to Statement 1 or 2, further comprising: removing the patterned layer from the remaining (unaffected by the energy) precursor material in the precursor material layer.

Statement 4. A method according to any one of the preceding Statements, where the patterned layer is translated relative to a surface of the liquid precursor material.

Statement 5. A method according to any one of the preceding Statements, further comprising: forming a second precursor material layer (which may be the same or different precursor material than the precursor material in the precursor material layer); applying a second energy to the precursor material layer such that a second product material is formed in the second precursor material layer, wherein the second product material layer is continuous or discontinuous and is capable of being separated from the remaining precursor material in the precursor material layer and is disposed on the first product material layer.

Statement 6. A method according to any one of the preceding Statements, further comprising removing the second patterned layer from the remaining (unaffected by the energy) precursor material in the second precursor material layer.

Statement 7. A method according to any one of the preceding Statements, further comprising application of an electrostatic potential across the liquid-fluid or liquid-liquid interface.

Statement 8. A method according to any one of the preceding Statements, further comprising repeating the forming and the applying steps until the entire printed structure is completed.

Statement 9. A method according to according to any one of the preceding Statements, where the forming and the applying steps are repeated 1 to 100, 1 to 1000, 1 to 10,000, or 1 to 100,000 times.

Statement 10. A method according to any one of the preceding Statements, where the forming and the applying steps are repeated continuously.

Statement 11. A method of according to any one of the preceding Statements, where the forming and the applying steps are repeated in a batch mode.

Statement 12. A system comprising: a chamber defining a first opening and a second opening; a window disposed in the first opening; a light source configured to direct a beam into the chamber through the window; a build stage disposed in the chamber; and a material injection system disposed in the second opening, wherein the material injection system is configured to provide a liquid to the chamber, and wherein this liquid is configured to form one or more product material layers (e.g., an article of manufacture).

Statement 13. A system according to Statement 12, where the light source is configured to provide digital light processing or stereolithography.

Statement 14. A system of any one of Statements 12 or 13, further comprising a gas injection system and a gas exhaust system in fluid communication with the chamber.

Statement 15. A system of any one of Statements 12 to 14, wherein the gas injection system is configured to provide an inert gas into the chamber.

Statement 16. A system of Statement 15, wherein the inert gas is nitrogen or air.

Statement 17. A system of any one of Statements 12 to 16, wherein the window is fabricated of Kapton.

Statement 18. A system of any one of Statements 12 to 17, wherein the material injection system is configured to adjust a height of liquid in the chamber with a resolution of 5 nm or less.

Statement 19. A system of any one of Statements 12 to 18, wherein the build stage is configured to translate toward or away from the window.

Statement 20. A system of any one of Statements 12 to 19, herein the build stage has a translation resolution of 2-5 µm.

Statement 21. A system of any one of Statements 12 to 20, wherein the chamber is configured to apply a potential across the liquid-fluid or liquid-liquid interface.

Statement 22. A method of forming an article of manufacture (e.g., a three-dimensional article of manufacture) using additive manufacturing comprising: illuminating (e.g., using UV light, visible light, IR light, or X-ray light or a combination thereof) a liquid in a chamber through a window with a light source to form at least part of the article on a build stage; translating a build stage with respect to the window and/or adding more of the liquid to the chamber with a material injection system; and forming one or more product material layers or an article of manufacture.

Statement 23. A method of Statement 22, wherein the illuminating comprises digital light processing or stereolithography.

Statement 24. A method of any one of Statements 22 or 23, further comprising contacting a surface of the liquid in the chamber with an inert gas.

Statement 25. The method of any one of Statements 22 to 24, wherein the inert gas is nitrogen or air.

Statement 26. The method of any one of Statements 22 to 25, wherein the material injection system is configured to adjust a height of liquid in the chamber with a resolution of 5 nm or less.

Statement 27. The method of any one of Statements 22 to 26, wherein the build stage is configured to translate toward or away from the window.

Statement 28. An article of manufacture (e.g., an article of manufacture of the present disclosure).

Statement 29. An article of manufacture according to Statement 28, wherein the article of manufacture is made by a method of the present disclosure (e.g., a method of any one or more of Statements 1-11 or 22-27) or using a system of the present disclosure (e.g., a system of any one or more of Statements 10-21).

The examples below are meant to be illustrative and not limiting in any way.

Example 1

The following is an example of methods of the present disclosure.

Interface effects are known to play a role in the nucleation and growth processes of atomic crystals and QD superlattices alike. The formation of QD superlattices from thin liquid films may be dominated by heterogeneous nucleation at a two-phase interface (e.g., the interface between two immiscible liquids, liquid/solid (l/s), or liquid/gas (l/g)). The former case leads to analogies of applying atomic-scale principles, such as epitaxial growth, lattice mismatch, and lattice strain to tailor the growth of QD superlattices.

Figure 5:
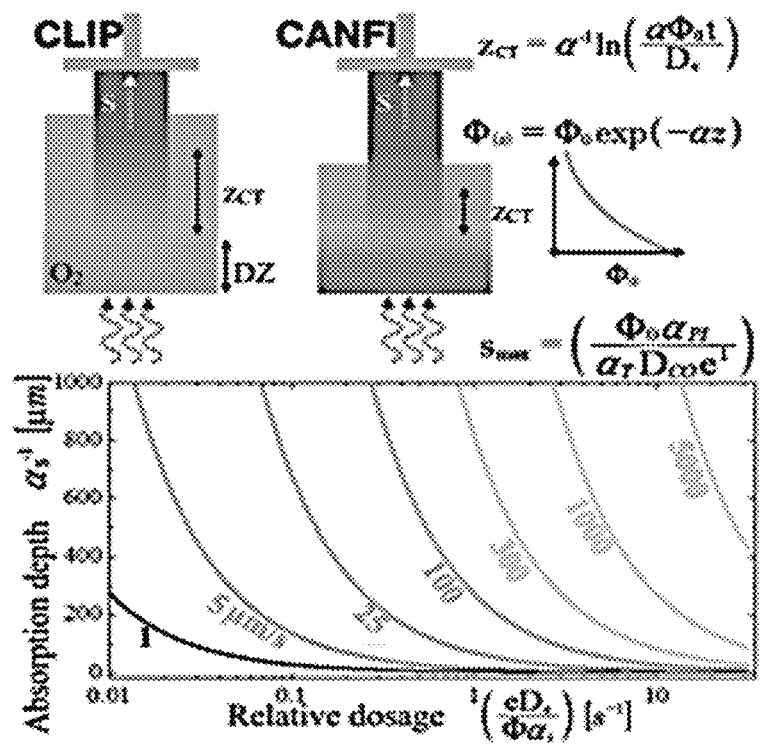
FIG. 5 shows is an analytical model of the relationship between print speed, dosage, and absorption depth for continuous 3D printing using the CLIP and continuous additive nanomanufacturing at fluid interfaces (CANFI) approach.
Figure 6:
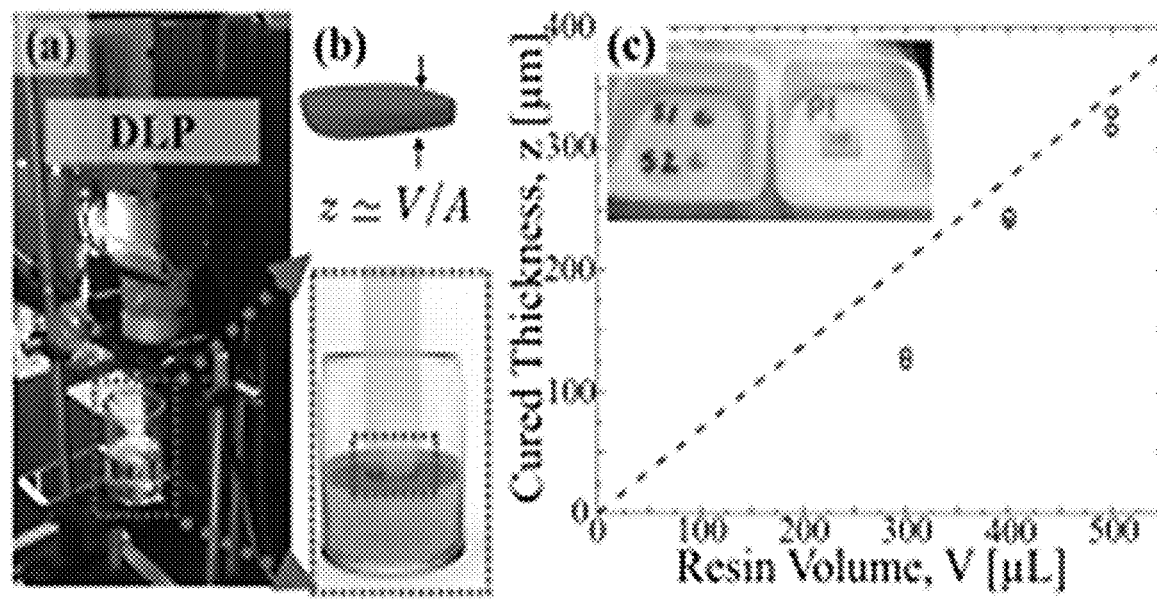
FIG. 6 shows initial proof-of-concept CANFI studies. (a) Photograph of first prototype using a customized DLP to expose a liquid thin film, (b) model of the pattern thickness and (c) 'working curve' showing relation between pattern thickness and volume of PLF.

FIG. 5 is an analytical model, i.e. the trends shown in the figure are calculated. FIG. 6 compares the film thickness effects in the CLIP and CANFI process and provides a quantitative model for the relationship between the cured depth ($z_{CT}$) as a function of photodose ($\Phi$), absorption ($\alpha$), curing dosage ($D_c$), and print speed (s). The CANFI process has multiple advantages, including: (i) robust and precise control of the active zone thickness through metered addition of the photoresin, (ii) the versatility to form multi-component structures by modifying the formulation of the thin liquid film; and (iii) the ability to photoexpose the interface from the top or the bottom. Moreover, the absorption coefficient of semiconductor QDs is approximately an order of magnitude larger than for organic compounds. The strong optical absorption of QD structures can thus help to further push the attainable vertical resolution of fabricated structures.

Mixing colloidal nanomaterials in the photoactive resin presents myriad opportunities to create composite materials with tunable properties. For example, our experiment in FIG. 7c demonstrates the ability to disperse colloidal PbSe QDs in the cured resin.

The CANFI process can be used to fabricate high-fidelity, hierarchical 3D structures with complex, programmable geometries. Based on the dosage (~50 mJ/cm$^2$) for laser-induced sintering of QDs and typical laser power encountered in SLA processing (up to 150000 mW/cm$^2$, e.g. SLA 250/50HR), partial fusing neighboring QDs at sub-microsecond time scales is expected. Such rapid, non-equilibrium processing through controlling the duration and fluence affords control over the degree of interconnection between neighboring dots. Characterization can be interpreted in context of the underlying heat transport from the photoexcited dot to the surrounding environment.

CANFI can be used to fabricate structures from specific QD superlattice allotropes shown in FIG. 2a. By controlling the solvent vapor annealing conditions during CANFI processing, the formation of specific allotropes (e.g., square and honeycomb lattices) can be directed and fused to form multi-layered structures. Topological states and Dirac cones may be possible.

Access to binary superlattices similar to the one shown in FIG. 4 enables selectively sintering one sub-component of the lattice. Controlled fusion PbSe QDs within the framework defined by an AB6 superlattice has been demonstrated. FIG. 8a illustrates candidate binary structures in which either one, or both sub-phases of the superlattice are fused. This selective fusion can be accomplished by two routes. First, direct, inorganic, dot-to-dot connections from direct photoexcitation can be formed by combining constituent particles whose melting thresholds are tuned by composition and size. Alternatively, the selective sintering can also be accomplished by functionalizing the surface of one of the nanoparticle components in the binary lattice with a photoactive linker.

The creation of layered structures with multiple compositions in an unprecedented spatial resolution and structural complexity is a benefit of the CANFI process. To demonstrate this capability, multi-layered structures, such as the one shown in FIG. 8b, were fabricated. The compositional gradient illustrated in FIG. 8b results from the gradual change of the composition in the PLF during CANFI processing. A basic mass balance model accounts for the depletion of the precursor in the printed layer and the replacement of the alternate composition to model the compositional gradients that can be obtained as a function of PLF thickness, composition, and print speed. The ability to control compositional gradients has practical implications, such as those in graded heterojunction QD optoelectronic devices.

To demonstrate the CANFI process, a photopatterning system comprising a digital light processing (DLP) chip projected patterns on the PLF spread across water as shown in FIG. 6. The DLP projector was modified electronically to produce the photon flux required to photo initiate the polymer resin PbSe QDs mixture. The Flux was measured directly with a sensor to ensure optimal flux for a specific liquid interface distance. The mixture was designed to be immiscible in water to maintain a clear liquid interface. A set of experiments in which different amounts of mixtures were introduces to the experiment chamber and were patterned, all tested samples were then measured by a micrometer to ensure highest accuracy.

Experiments validated that the CANFI process works with PLF comprised of commercially available resins (P1) and composites based on resins and colloidal PbSe QDs (S1 and S2) dispersed across an aqueous subphase. The working curve from the experiments shows that the thickness of the printed structure is slightly less than the theoretical value expected from basic geometric arguments of the PLF volume (V) and area (A) of the film. This deviation may be due to capillary effects (e.g., PLF is thinner near the center than the perimeter), may be due to limitations of the absorption depth, or may be due to other mechanisms.

The CANFI setup was designed to address multiple design parameters. Precise adjustment of the height and thickness of the PLF layer from which test structures are printed is possible. Specifically, the height of the active layer can be readily adjusted by changing the volume of the liquid subphase through port 3. The thickness of the PLF coating the subphase can be adjusted by microinjection of the photoactive solution through port 4. In context of printing structures from self-assembled QD monolayers, this process can yield a z-resolution as low as single-QD layer thickness resolution, or approximately 5 nm. Coarse adjustment of the CANFI cell relative to the optical system will be done through the z-stage adjustment of the DLP or SLA system. The minimum z-stage resolution of the SLA system is on the order of 2-5 μm.

The ambient gas environment was controlled by flowing a slow stream of nitrogen or air with a controlled amount of solvent vapor through ports 5 and 6. This affords control over the rate of evaporation of solvent from the active layer. This may involve controlled solvent vapor exposure and analytical models of the change of the solvent vapor concentration based on the flow and geometry of the chamber. Moreover, the provision for an inert gas flow through ports 5, 6 will enable processing active layers with a broad range of chemistries, including air-sensitive compounds.

CANFI has versatile photoexposure geometries. The exposure geometry (i.e., top-down or bottom-up exposure of the PLF) in CANFI can be changed by switching the position of the window (1) and the build stage (2).

Digital light processing (DLP) presents several advantages including simple maskless exposure and the ability to select specific exposure wavelengths (typically 365 nm, 405 nm, 550 nm), which will allow a range of photoreactions including commercial resins and experimental photoresponsive linkers.

Stereolithography (SLA) patterning of the PLF with controlled photodosage can extend the control over the photoinitated transformation in the active layer. The extent of QD coalescence can be controlled by the photodosage.

Surface tension effects were taken into consideration in the design of the CANFI cell. By positioning the build stage far (>10 mm) from the side wall and constructing the side wall and build stage from Teflon®, deformation of the liquid surface due to capillary effects can be mitigated. The CANFI cell shares many of the requirements and characteristics of a Langmuir-Blodgett trough such as: the need for high cleanliness and purity of the components (e.g., high-purity, 1.8 GΩ-m, deionized water) and an enclosure to prevent contamination or oxidation from air. The CANFI cell is mounted on a vibration isolation table to further stabilize the liquid surface. CANFI cells can be equipped with a surface tension measurement setup to directly monitor monolayer coverage during the assembly.

Multiprobe experiments can be used with CANFI. A Kapton® window can be located in the front (not shown) and back of the cell. This configuration will make it possible to probe the evolution of the printed structure, in real time and reciprocal space with atomic resolution.

In the context of environmentally conscious design and manufacturing, a notable advantage of the CANFI process is the efficient utilization of the "ink" in the PLF compared to conventional DLP printers in which the entire bath is filled with resin.

CANFI can use a versatile array of materials. Polymer resins can be used to form structures. For example, acrylic monomers (e.g., veroclear RGD810 from stratasys) can be used. To further refine the model (FIG. 5) and working curve (FIG. 6) for top-down and bottom-up exposure, CANFI processing with photoactive layers comprised of independently controlled amounts of monomer and photoinitiator (e.g., trimethylolpropane triacrylate monomers and diphenyl (2,4,6-trimethyl-benzoyl)phosphine oxide as photoinitiator) are possible.

Colloidal QD building blocks can be synthesized. QDs with size polydispersity less than 5% can be achieved without post-synthesis refinement since access to uniform QD building blocks is a key prerequisite to form high-fidelity superstructures with long-range spatial coherence. For example, PbSe QDs in the size range of 4-6 nm can be fabricated. These particles are known to assume the shape of a truncated cube defined by 8 {111} facets and 6 {100} facets.

Beyond polyhedral QDs (so called 0D building blocks), superstructures can be fabricated from elongated quantum rods (e.g., 1D building blocks). Whereas the CdSe dot within the heterostructure is isotropic, the CdS rod is elongated along the c-axis of the wurtzite crystal structure. The anisotropic shape of CdS and CdSe NRs has previously been related to linearly polarized emission and aspect ratio dependent Stokes shifts. The "dot-in-rod" heterostructure may be advantageous since the optical properties of the rod depend on the orientation of the rod relative to the optical axis whereas the absorption of the dot is insensitive to the dot orientation and therefore provides a convenient internal calibration for structure dependent optical characterization.

Example 2

The following is an example of methods of the present disclosure.

Figure 9:
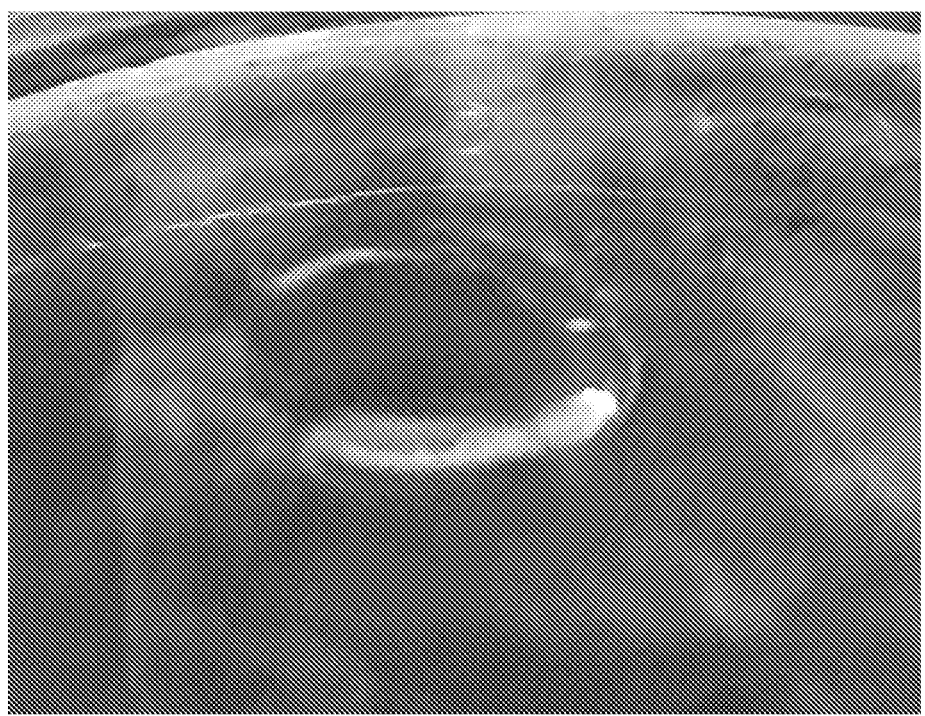
FIG. 9 shows formation of the letter "C" at a liquid-liquid interface, the letter is made out of a formulation that includes PbSe Nano-particles. This is a live image while the process is taking place.
Figure 10:
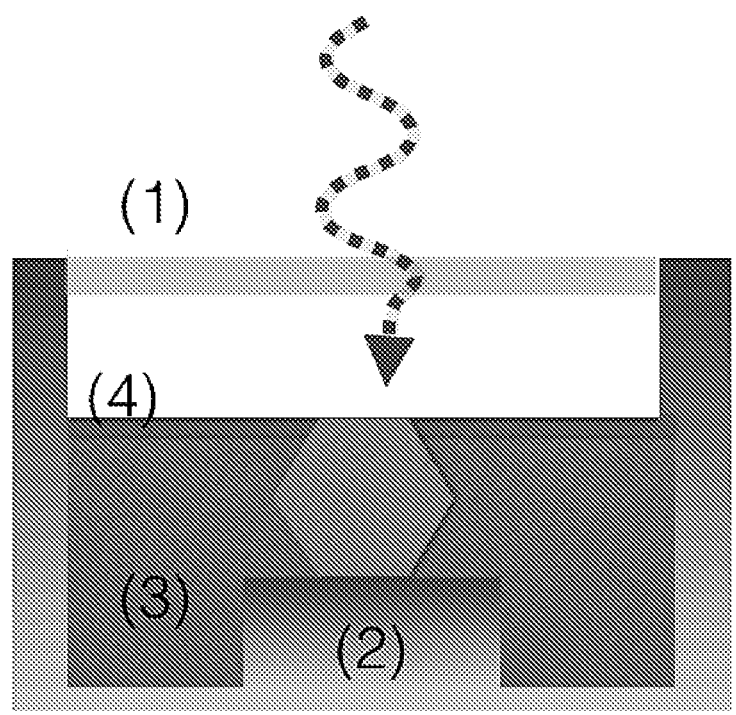
FIG. 10 shows examples of CANFI cells. A schematic representation of a CANFI cell used in a "top illumination" mode/configuration where (1) is an exposure window, (2) is a build stage, (3) is a subphase fluid, and (4) is a resin layer.

FIGS. 9-11 demonstrate examples of methods of the present disclosure. By using a liquid-liquid interface we demonstrated printing resolution down to 5 nm in thickness. Unlike previous methods, we avoided unnecessary support material or structures, since the base solvent is uncurbable it means that the only cured material is at the printed layer level.

Experimental System Description. System Structure: the mechanical support structure was custom constructed, specifically we used optical plates (base and back) as well as brackets optical polls etc. This assembly was used as the mechanical frame that holds all sub systems in our prototype. System Electronics: the electronic system was custom created to specifically control the software/hardware/power requirements of our sub systems. It includes a power supply, a control board and an integrated software. Source: our projection source is a 385 nm Wintech UV projector that have both a UV source and a DMD Chip, it includes a power input, a USB input and an HDMI input. Micro injector: a microfluidic pump was made that allowed deposition of small amount of solvents. This allows us to control sub-micron resolution of the printed layer when forming at liquid-liquid interface. Source usage: we projected images via our software platform that was then converted and projected on top of the surface. The UV source is used to photoexcite the photo initiator in the following example.

Pre-printing. Resin was formulated for this case by mixing curable resin, toluene and QD. A glass dish was cleaned and was used as the printing tray. UV covers were introduced to avoid undesirable curing.

Printing. All systems were connected to the main control board. Electrical power was then supplied to all sub systems. A tray with EG was introduced on top of the system structure right under the source. A printing material was then injected via micro injector on top of the EG to the desired thickness. A command was then given to the source to project a specific pattern (in our case a capital "C"). The letter is then formed at the liquid-liquid interface as can be seen in the image in FIG. 9.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

The invention claimed is:

1. A method of forming an article of manufacture comprising:
   providing a liquid precursor material layer having a thickness of 1 nm to 1 mm, wherein the liquid precursor material layer comprises a precursor material, disposed on a non-curable, fluid support material layer or a non-curable, liquid support material layer, wherein the precursor material and the non-curable, fluid support material or the non-curable, liquid support material are different materials, the liquid precursor material and the non-curable, fluid support material or the non-curable, liquid support material are immiscible, the liquid precursor material layer and non-curable, fluid support material layer or the non-curable, liquid support material layer are discrete layers, and a liquid-fluid or a liquid-liquid interface is formed between the precursor layer and the non-curable, fluid support material layer or the non-curable, liquid support material layer;
   applying an electrostatic potential across the liquid-fluid or the liquid-liquid interface to modulate the concentration of the precursor material at the liquid-fluid or the liquid-liquid interface, wherein the applying an electrostatic potential comprises applying a first electrostatic potential to the precursor material and applying a second electrostatic potential to the non-curable, fluid support material layer or the non-curable, liquid support material layer, wherein the first electrostatic potential and the second electrostatic potential are different; and
   applying energy to the liquid precursor material layer such that a product material is formed at the liquid-fluid interface or the liquid-liquid interface, wherein the product material layer is continuous or discontinuous and is capable of being separated from the remaining precursor material in the liquid precursor material layer.

2. The method of claim 1, wherein the liquid precursor layer comprises a molecular level, self-assembled material.

3. The method of claim 1, wherein the energy is infrared light, visible light, ultraviolet light, or x-ray light.

4. The method of claim 1, wherein the product material layer is a patterned layer, the method further comprising: removing the patterned layer from the remaining precursor material in the liquid precursor material layer that is unaffected by the energy.

5. The method of claim 1, wherein the product material layer is a patterned layer, and wherein the patterned layer is translated relative to a surface of the liquid precursor material layer.

6. The method of claim 1, further comprising:
   forming a second liquid precursor material layer, comprising a second precursor material which may be the same or different precursor material than the precursor material in the precursor material layer; and
   applying a second energy to the second liquid precursor material layer such that a second product material is formed in the second liquid precursor material layer, wherein the second product material layer is continuous or discontinuous and is capable of being separated from the remaining second precursor material in the second precursor material layer and is disposed on the first product material layer.

7. The method of claim 6, wherein the second product material layer is a second patterned layer, the method further comprising removing the second patterned layer from the remaining second precursor material in the second liquid precursor material layer that is unaffected by the energy.

8. The method of claim 1, further comprising repeating the forming and the applying steps until the article of manufacture is completed.

9. The method of claim 8, wherein the forming and the applying steps are repeated 1 to 100, 1 to 1000, 1 to 10,000, or 1 to 100,000 times.

10. The method of claim 8, wherein the forming and the applying steps are repeated continuously.

11. The method of claim 8, wherein the forming and the applying steps are repeated in a batch mode.

12. The method of claim 1, wherein the non-curable, liquid support material layer is a polar solvent or a halogenated solvent.

13. The method of claim 1, wherein the non-curable, fluid support m aterial layer is a supercritical fluid.

14. The method of claim 1, wherein the liquid precursor material layer has a thickness of 1 nm to 1 micron.

15. The method of claim 1, wherein the liquid precursor material layer further comprises a plurality of nanoparticles.

16. The method of claim 1, wherein the applying energy comprises illuminating the liquid precursor material layer in a chamber through a window with a light source to form at least part of the article on a build stage.

17. The method of claim 16, wherein the illuminating comprises digital light processing or stereolithography.

18. The method of claim 16, further comprising contacting a surface of the liquid precursor material layer in the chamber with an inert gas.

19. The method of claim 16, wherein the build stage is configured to translate toward or away from the window.

20. The method of claim 16, further comprising:
   translating the build stage with respect to the window and/or adding a liquid precursor material to the chamber with a material injection system; and
   forming one or more product material layers or the article of manufacture.

21. The method of claim 20, wherein the one or more product layers is protected by a blanket gas chosen from nitrogen and argon.

22. The method of claim 20, wherein the material injection system is configured to adjust a height of the liquid precursor material in the chamber with a resolution of 5 nm or less.

* * * * *